United States Patent
Tumbleston et al.

(10) Patent No.: US 11,859,027 B2
(45) Date of Patent: Jan. 2, 2024

(54) APPARATUS FOR DETERMINING THE PHOTOSENSITIVITY OF A STEREOLITHOGRAPHY RESIN

(71) Applicant: CARBON, INC., Redwood City, CA (US)

(72) Inventors: John R. Tumbleston, Menlo Park, CA (US); Ariel M. Herrmann, San Francisco, CA (US); Matthew Panzer, Redwood City, CA (US); Tabor Baranti, San Francisco, CA (US)

(73) Assignee: Carbon, Inc., Redwood City, CA (US)

( * ) Notice: Subject to any disclaimer, the term of this patent is extended or adjusted under 35 U.S.C. 154(b) by 990 days.

(21) Appl. No.: 16/741,821

(22) Filed: Jan. 14, 2020

(65) Prior Publication Data
US 2020/0231713 A1    Jul. 23, 2020

Related U.S. Application Data

(60) Provisional application No. 62/794,012, filed on Jan. 18, 2019.

(51) Int. Cl.
*G01N 33/68* (2006.01)
*G01N 21/33* (2006.01)
(Continued)

(52) U.S. Cl.
CPC .............. *C08F 2/01* (2013.01); *B29C 64/295* (2017.08); *B33Y 10/00* (2014.12); *B33Y 30/00* (2014.12);
(Continued)

(58) Field of Classification Search
CPC . C08F 2/01; C08F 2/48; B29C 64/295; B29C 64/393; B33Y 10/00; B33Y 30/00;
(Continued)

(56) References Cited

U.S. PATENT DOCUMENTS 5,236,637 A    8/1993  Hull
5,391,072 A    2/1995  Lawton et al.
(Continued)

FOREIGN PATENT DOCUMENTS

CN    109175366 A  *  1/2019  ............ B22F 3/1055

OTHER PUBLICATIONS

Jacobs, Paul F., "Chapter 10: Diagnostic Testing", Rapid Prototyping & Manufacturing: Fundamentals of Stereolithography (1st Ed. 1992), 1992, 249-285.
(Continued)

*Primary Examiner* — Jennifer Wecker
*Assistant Examiner* — Oyeleye Alexander Alabi
(74) *Attorney, Agent, or Firm* — Myers Bigel, P.A.

(57) ABSTRACT

A test cell useful for determining the photosensitivity of a photopolymerizable material, includes a support plate having a top surface portion, a bottom surface portion, and an opening extending therebetween, a light-transmissive base member removably or permanently connected to said bottom surface portion to form with said opening a well, into which well photopolymerizable material can be deposited, and a sensor comprising a thermal sensor, strain sensor, or combination thereof operatively associated with said light-transmissive base member.

33 Claims, 5 Drawing Sheets

(51) Int. Cl.

| | | |
|---|---|---|
| *G01N 21/64* | (2006.01) | |
| *G01N 33/52* | (2006.01) | |
| *C07C 309/65* | (2006.01) | |
| *C07C 309/73* | (2006.01) | |
| *A01N 1/02* | (2006.01) | |
| *G01N 1/40* | (2006.01) | |
| *C08F 2/01* | (2006.01) | |
| *C09D 11/101* | (2014.01) | |
| *H05B 6/06* | (2006.01) | |
| *G03F 7/09* | (2006.01) | |
| *C08F 2/48* | (2006.01) | |
| *B29C 64/295* | (2017.01) | |
| *B29C 64/393* | (2017.01) | |
| *B33Y 10/00* | (2015.01) | |
| *B33Y 30/00* | (2015.01) | |
| *B33Y 40/00* | (2020.01) | |
| *B33Y 50/02* | (2015.01) | |
| *B33Y 70/00* | (2020.01) | |

(52) U.S. Cl.
CPC ............... *B33Y 40/00* (2014.12); *B33Y 50/02* (2014.12); *B33Y 70/00* (2014.12); *C08F 2/48* (2013.01); *C09D 11/101* (2013.01); *G03F 7/09* (2013.01); *H05B 6/06* (2013.01)

(58) Field of Classification Search
CPC ......... B33Y 40/00; B33Y 50/02; B33Y 70/00; C09D 11/101; G03F 7/09; G03F 7/16; G03F 7/0037; H05B 6/06
See application file for complete search history.

(56) References Cited

U.S. PATENT DOCUMENTS

| | | | |
|---|---|---|---|
| 5,529,473 A | | 6/1996 | Lawton et al. |
| 5,798,684 A | * | 8/1998 | Endo .......................... G01J 5/20 338/18 |
| 7,892,474 B2 | | 2/2011 | Shkolnik et al. |
| 8,110,135 B2 | | 2/2012 | El-Siblani |
| 9,205,601 B2 | | 12/2015 | Desimone et al. |
| 9,211,678 B2 | | 12/2015 | Desimone et al. |
| 9,216,546 B2 | | 12/2015 | Desimone et al. |
| 9,453,142 B2 | | 9/2016 | Rolland et al. |
| 9,598,606 B2 | | 3/2017 | Rolland et al. |
| 9,676,963 B2 | | 6/2017 | Rolland et al. |
| 2002/0056945 A1 | * | 5/2002 | Gelbart ................. B29C 64/135 264/494 |
| 2012/0100304 A1 | * | 4/2012 | Cruchon-Dupeyrat ..................... C09D 11/101 427/553 |
| 2013/0292862 A1 | | 11/2013 | Joyce |
| 2013/0295212 A1 | | 11/2013 | Chen et al. |
| 2015/0331402 A1 | | 11/2015 | Lin et al. |
| 2015/0360419 A1 | | 12/2015 | Willis et al. |
| 2016/0288376 A1 | | 10/2016 | Sun et al. |
| 2017/0129167 A1 | | 5/2017 | Castanon |
| 2017/0129169 A1 | | 5/2017 | Batchelder et al. |
| 2018/0126630 A1 | | 5/2018 | Panzer et al. |
| 2018/0243976 A1 | | 8/2018 | Feller |
| 2018/0290374 A1 | | 10/2018 | Willis et al. |
| 2020/0047500 A1 | * | 2/2020 | Zhou .......................... B41J 2/447 |

OTHER PUBLICATIONS

Jacobs, Paul F., "Chapter 2, Section 2.7: Photopolymer Photospeed and Laser Scanning Velocity", Stereolithography and Other RP&M Technologies: from Rapid Prototyping to Rapid Tooling (1996), 1996, 54-56.

Jacobs, Paul F., "Chapter 2: Basic Polymer Chemistry", Rapid Prototyping & Manufacturing: Fundamentals of Stereolithography (1st Ed. 1992), 1992, 25-58.

Janusziewicz, Rima , et al., "Layerless fabrication with continuous liquid interface production", PNAS, 113, 2016, 11703-11708.

Poelma, Justin , et al., "Rethinking digital manufacturing with polymers", Science, 358(6369), 2017, 1384-1385.

Tumbleston, John R., et al., "Continuous liquid interface production of 3D Objects", Science, 347(6228), 2015, 1349-1352.

* cited by examiner

APPARATUS FOR DETERMINING THE PHOTOSENSITIVITY OF A STEREOLITHOGRAPHY RESIN

RELATED APPLICATIONS

The present application claims priority to U.S. Provisional Application Ser. No. 62/794,012, filed Jan. 18, 2019, the disclosure of which is hereby incorporated by reference in its entirety.

FIELD OF THE INVENTION

The present invention concerns apparatus and methods for measuring the photosensitivity of stereolithography resins.

BACKGROUND OF THE INVENTION

A group of additive manufacturing techniques sometimes referred to as "stereolithography" create a three-dimensional object by the sequential polymerization of a light polymerizable resin. Such techniques may be "bottom-up" techniques, where light is projected into the resin onto the bottom of the growing object through a light transmissive window, or "top down" techniques, where light is projected onto the resin on top of the growing object, which is then immersed downward into the pool of resin.

The recent introduction of more rapid stereolithography techniques sometimes referred to as continuous liquid interface production (CLIP) has expanded the usefulness of stereolithography from prototyping to manufacturing. See J. Tumbleston et al., *Continuous liquid interface production of 3D objects*, SCIENCE 347, 1349-1352 (published online 16 Mar. 2015); U.S. Pat. Nos. 9,211,678; 9,205,601; and 9,216,546 to DeSimone et al.; and R. Janusziewicz, et al., *Layerless fabrication with continuous liquid interface production*, PNAS 113, 11703-11708 (18 Oct. 2016).

Dual cure resins for additive manufacturing were introduced shortly after the introduction of CLIP, expanding the usefulness of stereolithography for manufacturing a broad variety of objects still further. See Rolland et al., U.S. Pat. Nos. 9,676,963, 9,453,142 and 9,598,606; J. Poelma and J. Rolland, *Rethinking digital manufacturing with polymers*, SCIENCE 358, 1384-1385 (15 Dec. 2017).

The greatly expanded usefulness of stereolithography brought about by the introduction of CLIP and dual cure resins in turn makes the accurate determination of resin photosensitivity—often on a resin batch-by-batch basis—extremely important. Prior techniques for determining resin photosensitivity, such as the WINDOWPANE™ test methodology developed by 3D systems (see, e.g., P. Jacobs, *Rapid Prototyping & Manufacturing: Fundamentals of StereoLithography*, pages 33, 270-274 (1st Ed. 1992)), require the printing of multiple test objects and measuring cure depth of multiple polymerized areas with a micrometer to determine a "working curve." Such techniques tend to be cumbersome, multi-step techniques susceptible to user-to-user variability due to differences in how resins are dispensed into the test environment, how objects are cleaned for application of a micrometer, the force with which the user applies the micrometer, and other human factors. Accordingly, new techniques for determining resin photosensitivity are needed.

SUMMARY OF THE INVENTION

Some embodiments of the present invention are directed to a test cell useful for determining the photosensitivity of a photopolymerizable material, including: (a) a support plate having a top surface portion, a bottom surface portion, and an opening extending therebetween; (b) a light-transmissive base member removably or permanently connected to the bottom surface portion to form with the opening a well, into which well photopolymerizable material can be deposited; and (c) a sensor comprising a thermal sensor, strain sensor, or combination thereof operatively associated with the light-transmissive base member.

The test cell may be combined with a light source, to carry out methods as described herein.

In some embodiments, said light transmissive base member is comprised of quartz, glass, sapphire, an organic polymer, or a combination thereof.

In some embodiments, said sensor comprises a non-contact infra-red sensor operatively associated with said light-transmissive base member.

In some embodiments, said sensor comprises a thermocouple connected to said base member.

In some embodiments, said sensor comprises a resistive temperature sensor connected to said base member.

In some embodiments, said sensor comprises a thin film sensor connected to said base member.

In some embodiments, said thin film sensor comprises: (i) a resistive element; (ii) a pair of input arms electrically connected to said resistive element; and (iii) optionally, one or two sense arms electrically connected to said resistive element.

In some embodiments, said resistive element, said input arms, and optionally said sense arms when present, are comprised of platinum, titanium, or indium tin oxide (ITO).

In some embodiments, said input arms, and optionally said sense arms when present, further comprise a conductive upper coat.

In some embodiments, the test cell further includes a light transmissive protective top coating formed on said sensor.

In some embodiments, said sensor comprises a plurality of sensors.

In some embodiments, the test cell further includes a plurality of captive fasteners connected to said support plate and extending downward from said bottom surface portion.

In some embodiments, the test cell further includes an alignment assembly connected to or formed on said support plate bottom surface portion In some embodiments, the test cell further includes a secondary well formed in said support plate, said secondary well having an optionally removable, light-transmissive, floor.

In some embodiments, said photopolymerizable material comprises a stereolithography resin, a lithography resist, or a light-curable printing ink.

Some embodiments of the present invention are directed to methods of determining the photosensitivity of a photopolymerizable material can be carried out by: (a) depositing a sample of the photopolymerizable material into the well of a test apparatus as described herein; (b) exposing the photopolymerizable material to a predetermined dose of light through the base member; and (c) sensing heat and/or strain generated by the resin with the sensor in response to the exposure as a measure of the photosensitivity of the photopolymerizable material.

In some embodiments, said sensing step is carried out by taking a plurality of heat and/or strain measures during said exposing step.

In some embodiments, said sensing step includes determining an induction time for said photopolymerizable material in response to said dose of light, with a shorter induction time indicating greater photosensitivity.

Some embodiments of the present invention are directed to a test apparatus useful for measuring the photosensitivity of a photopolymerizable material, including: (a) a test cell including: a support plate having a top surface portion, a bottom surface portion, and an opening extending therebetween; a light-transmissive base member removably or permanently connected to said bottom surface portion to form with said opening a well, into which well photopolymerizable material can be deposited; and a sensor comprising a thermal sensor, strain sensor, or combination thereof operatively associated with said light-transmissive base member; and (b) a light source operatively associated with said test cell and configured to direct light through said base member.

In some embodiments, the test apparatus further includes (c) an outer housing; (d) a test chamber, with said test cell positioned in said test chamber; and (e) a door connected to said outer housing and through which said test chamber is accessed. Said light source may be contained within said outer housing (but optionally outside said test chamber).

In some embodiments, the test apparatus further includes a temperature sensor operatively associated with said test chamber.

In some embodiments, the test apparatus further includes a humidity sensor operatively associated with said test chamber.

In some embodiments, the test apparatus further includes a pressure sensor operatively associated with said test chamber.

In some embodiments, the test apparatus further includes an air inlet duct and an air outlet duct operatively associated with said test chamber, and configured for operative association with an air temperature and humidity control unit.

In some embodiments, said light source further includes a shutter configured for controlling light directed through said base.

In some embodiments, the test apparatus further includes an elevated pedestal within said test chamber on which said test cell is mounted.

In some embodiments, the test apparatus further includes a spill protection window positioned between said test cell and said light source (and between said test cell and said shutter when present).

Some embodiments of the present invention are directed to methods of determining the photosensitivity of a photopolymerizable material, comprising: (a) depositing a sample of said photopolymerizable material into the well of a test apparatus; and (b) exposing said photopolymerizable material to a predetermined dose of light through said base member; and (c) sensing heat and/or strain generated by said photopolymerizable material with said sensor in response to said exposure as a measure of the photosensitivity of said photopolymerizable material.

In some embodiments, the method further includes sensing the temperature, humidity, and/or pressure within said test chamber, concurrently with said step of (c) sensing heat and/or strain.

In some embodiments, the method further includes the step of: (d) determining the photosensitivity of said photopolymerizable material from said heat and/or strain sensed in step (c), and optionally from said sensed temperature, humidity, and/or pressure within said test chamber.

In some embodiments, said sensing step is carried out by taking a plurality of heat and/or strain measures during said exposing step.

In some embodiments, said sensing step includes determining an induction time for said photopolymerizable material in response to said dose of light, with a shorter induction time indicating greater photosensitivity.

While the methods and apparatus of the present invention are described herein primarily with reference to stereolithography resins, they can be applied to a variety of other photopolymerizable materials, such as lithography resists and light-curable printing inks.

Temperature sensors including thin film temperature sensors are known (see, e.g., U.S. Pat. No. 5,798,684), but their application to determining the photosensitivity of stereolithography resins has not heretofore been proposed.

The foregoing and other objects and aspects of the present invention are explained in greater detail in the drawings herein and the specification set forth below. The disclosures of all United States patent references cited herein are to be incorporated herein by reference.

DETAILED DESCRIPTION OF ILLUSTRATIVE EMBODIMENTS

Figure 1:
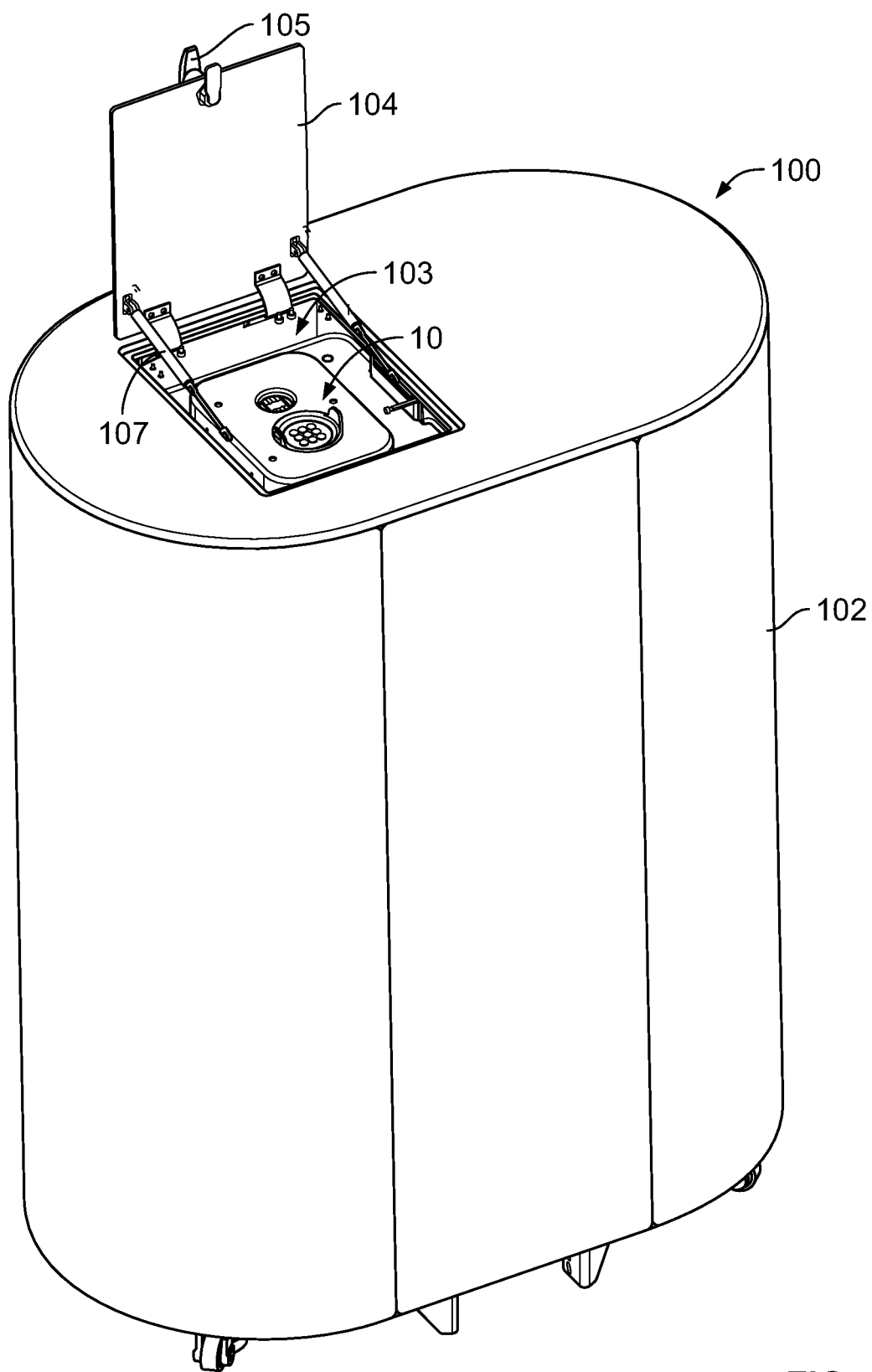
FIG. 1 is a perspective view of an apparatus of the present invention, with the test cell visible through the top door.

The present invention is now described more fully hereinafter with reference to the accompanying drawings, in which embodiments of the invention are shown. This invention may, however, be embodied in many different forms and should not be construed as limited to the embodiments set forth herein; rather these embodiments are provided so that this disclosure will be thorough and complete and will fully convey the scope of the invention to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the invention. As used herein, the singular forms "a," "an," and "the" are intended to include plural forms as well, unless the context clearly indicates otherwise. It will be further understood that the terms "comprises" or "comprising," when used in this specification, specify the presence of stated features, integers, steps, operations, elements components and/or groups or combinations thereof, but do not preclude the presence or addition of one or more other features, integers, steps, operations, elements, components and/or groups or combinations thereof.

As used herein, the term "and/or" includes any and all possible combinations or one or more of the associated listed items, as well as the lack of combinations when interpreted in the alternative ("or").

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and claims and should not be interpreted in an idealized or overly formal sense unless expressly so defined herein. Well-known functions or constructions may not be described in detail for brevity and/or clarity.

It will be understood that when an element is referred to as being "on," "attached" to, "connected" to, "coupled" with, "contacting," etc., another element, it can be directly on, attached to, connected to, coupled with, and/or contacting the other element or intervening elements can also be present. In contrast, when an element is referred to as being, for example, "directly on," "directly attached" to, "directly connected" to, "directly coupled" with, or "directly contacting" another element, there are no intervening elements present. It will also be appreciated by those of skill in the art that references to a structure or feature that is disposed "adjacent" another feature can have portions that overlap or underlie the adjacent feature.

Spatially relative terms, such as "under," "below," "lower," "over," "upper," and the like, may be used herein for ease of description to describe an element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus the exemplary term "under" can encompass both an orientation of over and under. The device may otherwise be oriented (rotated 90 degrees or at other orientations) and the spatially relative descriptors used herein interpreted accordingly. Similarly, the terms "upwardly," "downwardly," "vertical," "horizontal," and the like are used herein for the purpose of explanation only, unless specifically indicated otherwise.

It will be understood that, although the terms first, second, etc., may be used herein to describe various elements, components, regions, layers, and/or sections, these elements, components, regions, layers, and/or sections should not be limited by these terms. Rather, these terms are only used to distinguish one element, component, region, layer, and/or section, from another element, component, region, layer, and/or section. Thus, a first element, component, region, layer, or section discussed herein could be termed a second element, component, region, layer, or section without departing from the teachings of the present invention. The sequence of operations (or steps) is not limited to the order presented in the claims or figures unless specifically indicated otherwise.

1. Stereolithography Apparatus and Resins

Resins for additive manufacturing are known and described in, for example, DeSimone et al., U.S. Pat. Nos. 9,211,678; 9,205,601; and 9,216,546. Dual cure resins for additive manufacturing are known and described in, for example, Rolland et al., U.S. Pat. Nos. 9,676,963; 9,598,606; and 9,453,142. Non-limiting examples of dual cure resins include, but are not limited to, resins for producing objects comprised of polymers such as polyurethane, polyurea, and copolymers thereof; objects comprised of epoxy; objects comprised of cyanate ester; objects comprised of silicone, etc.

Techniques for additive manufacturing are known. Suitable techniques include bottom-up or top-down additive manufacturing, generally known as stereolithography. Such methods are known and described in, for example, U.S. Pat. No. 5,236,637 to Hull, U.S. Pat. Nos. 5,391,072 and 5,529,473 to Lawton, U.S. Pat. No. 7,438,846 to John, U.S. Pat. No. 7,892,474 to Shkolnik, U.S. Pat. No. 8,110,135 to El-Siblani, U.S. Patent Application Publication No. 2013/0292862 to Joyce, and US Patent Application Publication No. 2013/0295212 to Chen et al. The disclosures of these patents and applications are incorporated by reference herein in their entirety.

In some embodiments, the resins characterized by the methods described herein are used to carry out one of the family of methods sometimes referred to as continuous liquid interface production (CLIP). CLIP is known and described in, for example, U.S. Pat. Nos. 9,211,678; 9,205,601; 9,216,546; and others; in J. Tumbleston et al., Continuous liquid interface production of 3D Objects, *Science* 347, 1349-1352 (2015); and in R. Janusziewcz et al., Layerless fabrication with continuous liquid interface production, *Proc. Natl. Acad. Sci. USA* 113, 11703-11708 (Oct. 18, 2016). Other examples of methods and apparatus for carrying out particular embodiments of CLIP include, but are not limited to: Batchelder et al., US Patent Application Pub. No. US 2017/0129169 (May 11, 2017); Sun and Lichkus, US Patent Application Pub. No. US 2016/0288376 (Oct. 6, 2016); Willis et al., US Patent Application Pub. No. US 2015/0360419 (Dec. 17, 2015); Lin et al., US Patent Application Pub. No. US 2015/0331402 (Nov. 19, 2015); D. Castanon, US Patent Application Pub. No. US 2017/0129167 (May 11, 2017); B. Feller, US Patent Application Pub. No. US 2018/0243976 (published Aug. 30, 2018); M. Panzer and J. Tumbleston, US Patent Application Pub. No. US 2018/0126630 (published May 10, 2018); and K. Willis and B. Adzima, US Patent Application Pub. No. US 2018/0290374 (Oct. 11, 2018).

2. Test Cell and Test Apparatus.

Figure 2:
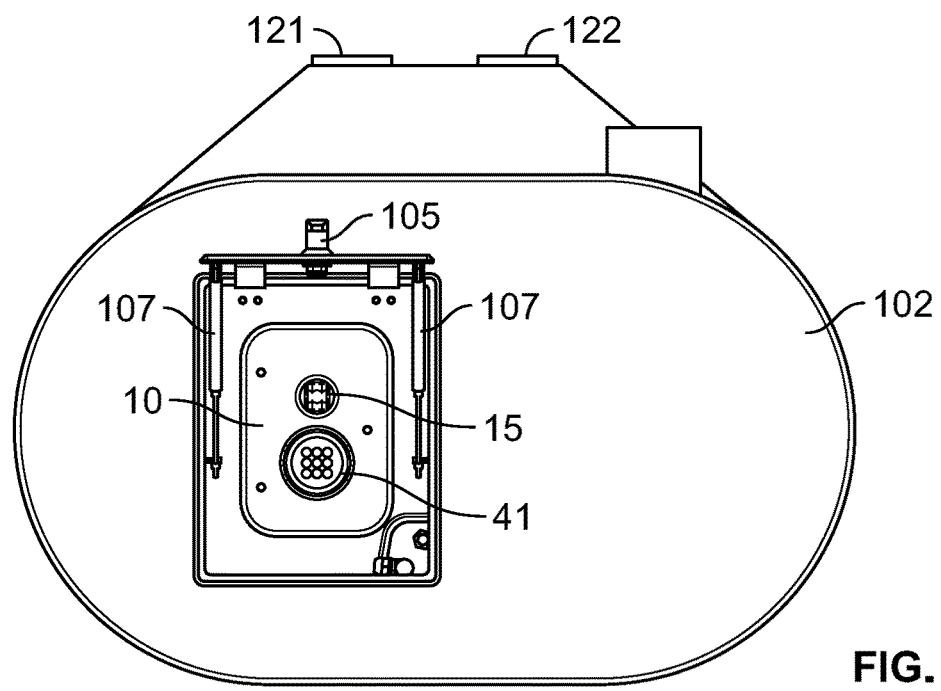
FIG. 2 is a plan view of the apparatus of FIG. 1.
Figure 3:
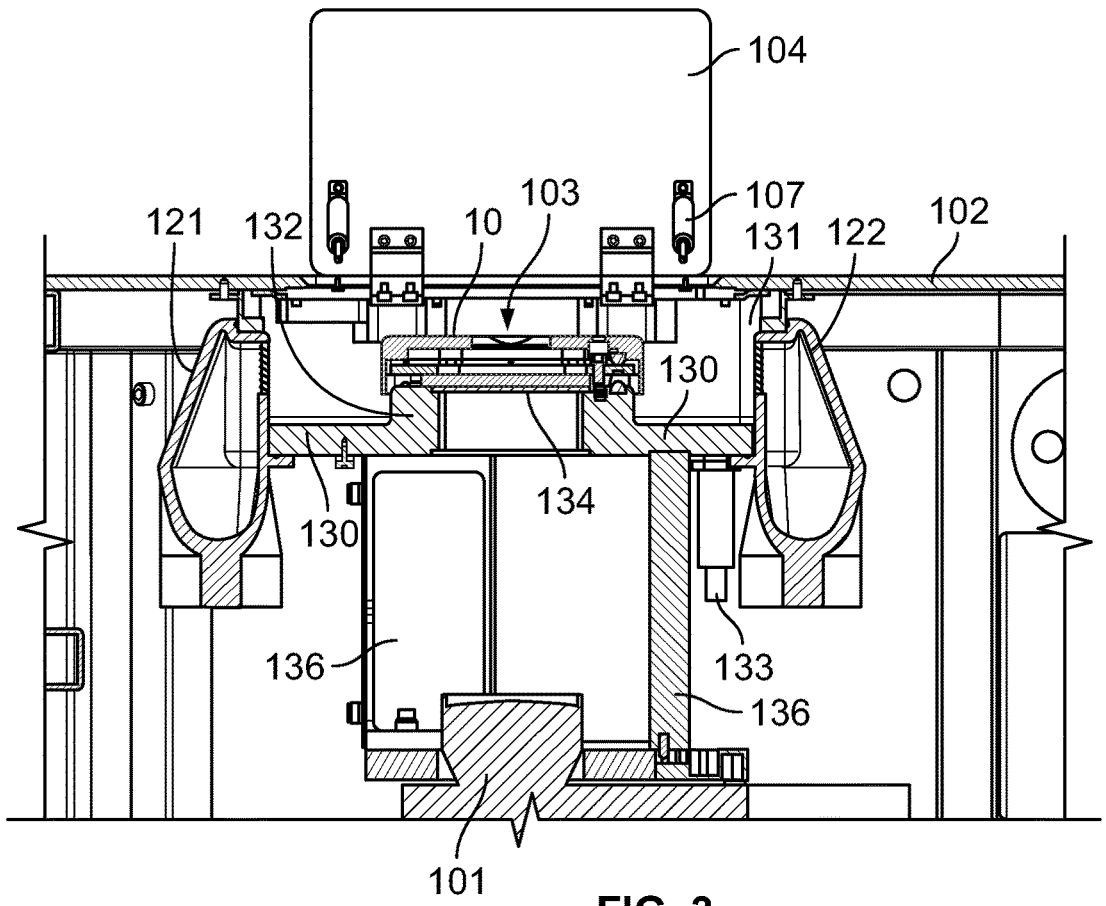
FIG. 3 is a side sectional view of the apparatus of FIG. 1, showing the test cell, test chamber, and surrounding structures.
Figure 4:
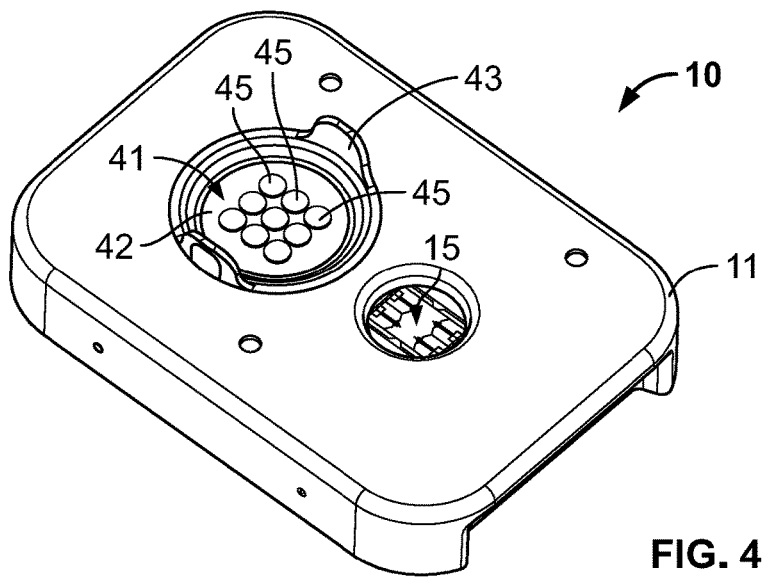
FIG. 4 is a perspective view of a test cell of the present invention, showing the thin film thermal sensor.
Figure 5:
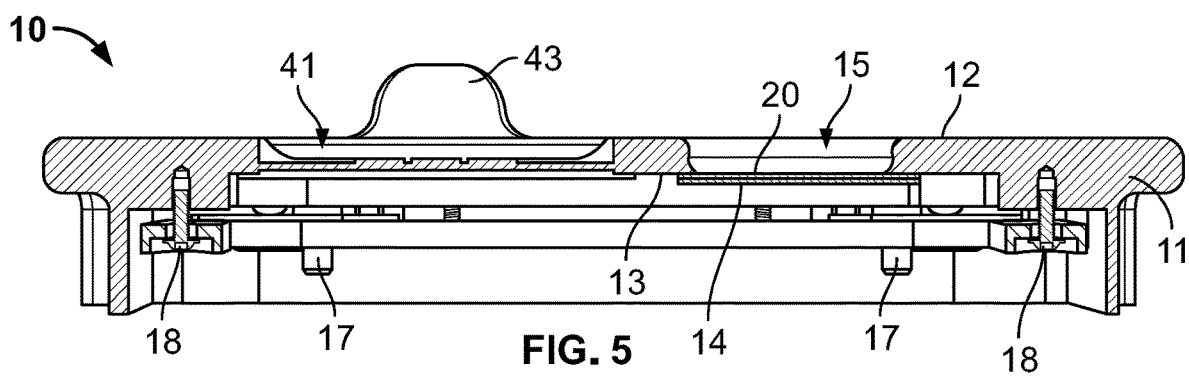
FIG. 5 is a side sectional view of the test cell of FIG. 4.
Figure 6:
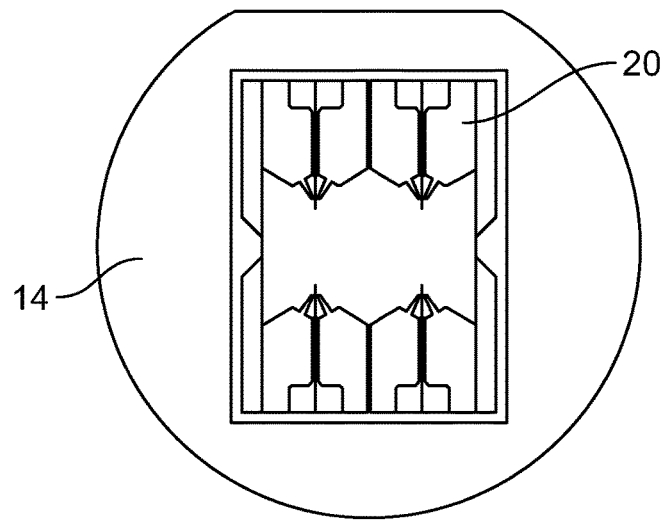
FIG. 6 is a plan view of the thin film thermal sensor in the test cell of FIG. 4.
Figure 7:
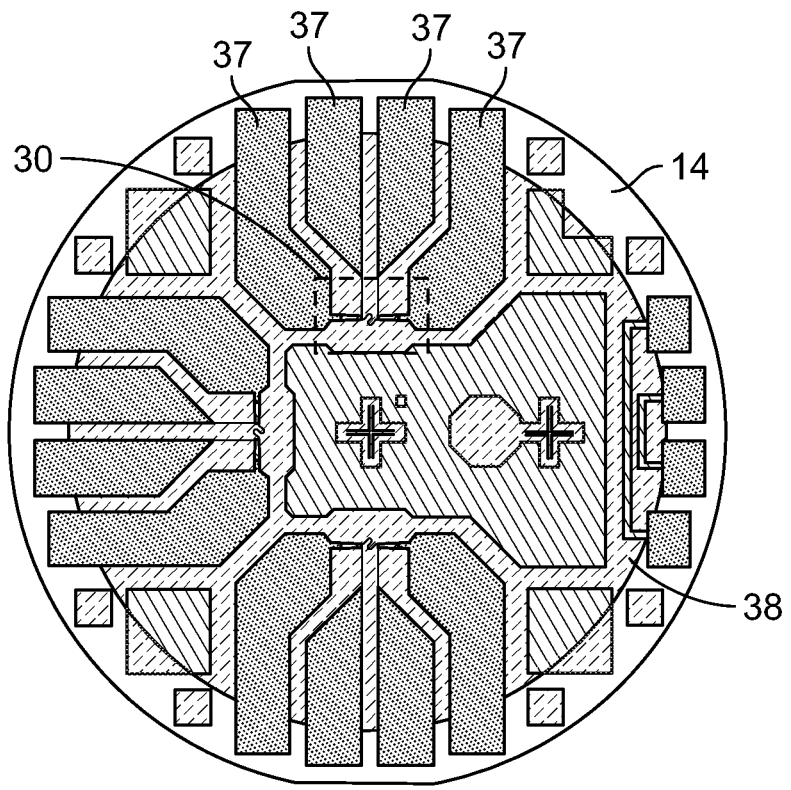
FIG. 7 is a top plan view of an alternate embodiment of a thin film thermal sensor useful in the present invention.
Figure 8:
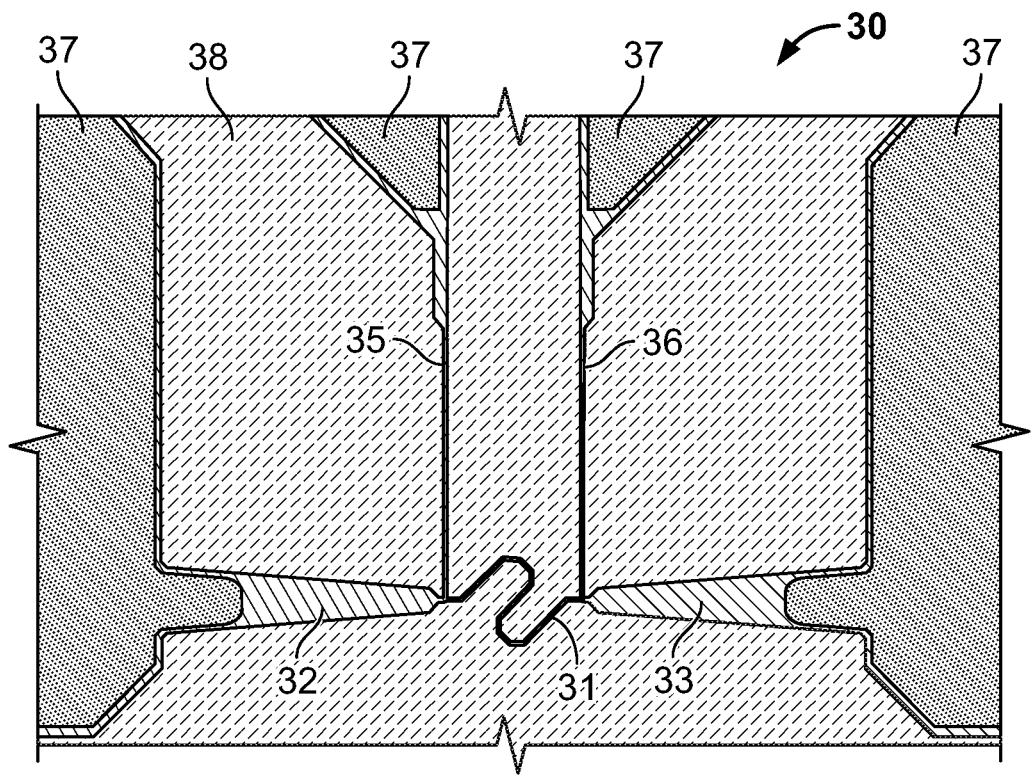
FIG. 8 is a detail plan view of a portion of the sensor of FIG. 7.

Apparatus. An embodiment of a test apparatus of the present invention is shown in FIGS. 1-3 (and schematically in FIG. 9) an embodiment of a test cell of the invention is shown in FIGS. 4-5, embodiments of a thermal sensor of the present invention is shown in FIGS. 6-8.

In the illustrative embodiment of the apparatus, the apparatus (see FIGS. 1-3) generally includes a light source (101) positioned in an outer housing (102) or cabinet, an inner test chamber (103), a door (104), optionally, but in some embodiments preferably, with a latch (105) providing access to the inner test chamber 103), optionally, but in some embodiments preferably, a gasket such as a silicone gasket (not shown) to seal the door, and a test cell (10) positioned within the test chamber. Gas springs, pneumatic hold-open cylinders (107) or the like are optionally included on the door for ease of operation, but hold open latches, or other alternatives, can be used. A test cell (10) is positioned in the inner chamber, as discussed further below.

In the illustrative embodiment, the test chamber includes a chamber floor (130), chamber side walls (131), and an elevated pedestal (132) on which the test cell (10) is placed (see FIGS. 2-3) (though numerous other configurations will be apparent to those skilled in the art). A shutter (not shown) can be included as a part of the light engine to more precisely control the light dose, if desired. A light transmissive spill protection window (134) is included to protect the light source and other apparatus components situated within the cabinet, but outside of the inner test chamber. The light source (101) is secured in place by a set of mounts (136) which are rigidly fixed to the test chamber (132), and hence to the test cell (10), by connecting them to the test chamber floor (130) (where the test chamber floor and pedestal are optionally but, in some embodiments preferably, a single piece, such as machined from a single piece of aluminum).

An air inlet duct (121) and an air outlet duct (122) are provided from the exterior of the cabinet into the test chamber, and air (optionally, but in some embodiments preferably, temperature controlled and humidity controlled) can be circulated through the chamber from an external air temperature and humidity control unit, such as available from Orion Machinery North America LLC, 126 Holmes, Liberty Hill, Texas, 78642 USA. Temperature and humidity sensors (see FIG. 9), can be operatively associated with the test chamber, and with the temperature and humidity control unit, in any suitable way, including positioning within the test chamber, within an inlet and/or outlet duct, etc. A barometric pressure sensor (133) can be positioned in any suitable location, including inside the test chamber, outside the test chamber within the cabinet (as shown in FIG. 3), on the exterior of the cabinet, etc.

Note that ducts, light sources, shutters, various circuit components, and the like are preferably located in a separate compartment (Chamber A of FIG. 9) outside of the inner test chamber (Chamber B of FIG. 9), although located within the outer housing or cabinet of the apparatus.

While an apparatus as described above is currently believed desirable for more accurate testing, it will be appreciated that a simplified apparatus, such as a table-top apparatus, may be also be used to carry out the methods of the present invention, particularly where less accuracy is required.

Test cell. The test cell (10) (see FIGS. 4-5) includes a support plate (11) having a top surface portion (12), a bottom surface portion (13), and an opening formed therein. A light transmissive base member (14) is directly or indirectly connected to the bottom surface portion so as to define with the opening a well (15) in which well a resin sample can be deposited. At least one, or a plurality of (e.g., two, three, four or more), sensors (20) are connected to or operatively associated with the base member. Suitable sensors include thermal sensors, strain sensors, and combinations thereof, and are discussed further below.

The light-transmissive base member (14) can be formed from any suitable polymeric or inorganic material, or inorganic material, including but not limited to quartz, glass (e.g., borosilicate glass), sapphire, an organic polymer, and combination thereof.

The support plate (11) can optionally include alignment features or aligners (18) (to align with corresponding or matching alignment features on the pedestal), and can optionally include screws (17) (or other fixation elements) for securing the test cell to the pedestal. In some embodiments, an alignment assembly including a plurality of aligners (18) for kinematic balls may be connected to or formed on the bottom surface portion (13) of the support plate (11).

Sensor. One preferred embodiment of a sensor (20) is shown in FIG. 6, and a second preferred embodiment of a sensor (20) is shown in FIGS. 7-8. Both comprise an array of thin film resistive sensors (30) as the sensor (20), with four separate sensors shown in the embodiment of FIG. 6, and three separate sensors shown in the embodiment of FIG. 7. A plurality of separate sensors are included in some embodiments to provide a back-up if one sensor should fail, and/or provide separate concurrent, simultaneous, or sequential tests (e.g., on the same sample of resin dispensed into the well), the results of which can be combined and/or compared to enhance accuracy. Resistive sensors can sense heat given off by the light polymerizable material during exposure to light due to the exothermic nature of the polymerization reaction, can sense strain exerted on the base as the resin polymerizes, or combinations thereof.

In both embodiments, a typically flat, light transmissive, base member has at least one (and indeed a plurality of) thin film resistive sensors formed thereon. Each thin film sensor includes a resistive element (31), a pair of input arms (32, 33) electrically connected to the resistive element (31); and optionally, but in some embodiments preferably, one or two sense arms (35, 36) electrically connected to the resistive element (while 3-arm sensing can be used, 4 arm sensing, or "Kelvin sensing" is currently preferred). The resistive element, the input arms, and the sense arms when present, are comprised of any suitable conductor, such as platinum, titanium, or indium tin oxide (ITO). The input arms (32, 33), and optionally the sense arms (35, 36) when present, further comprise a conductive (e.g., gold) upper coat (37) (e.g., configured to reduce parasitic resistance in the sensor array, and/or provide for better electrical contact to the array). A light transmissive protective top coating (38) (e.g., a silicon dioxide layer) can be formed on the sensor over the thin film array, and over the conductive upper coat when present.

The illustrated embodiment optionally further includes a secondary well (41) formed in the support plate, the secondary well having an optionally removable, light-transmissive, floor (42) (also referred to herein as a secondary window). The secondary well can be used to conduct an additional or alternate test of photosensitivity. Resin is depicted in the secondary well as a set of six polymerized spots (45) on which a conventional photosensitivity test may be performed, when the spots are of different heights due to different light exposures at each location. In some embodiments a lifting tab (43) may be included to facilitate removal of the secondary window (42).

While the test cell is described above primarily with reference to thin film resistive strain sensors, those skilled in the art will appreciate that other approaches can be used. For example, the array of thin film sensors can serve as strain sensors (e.g., sensing strain on the base member that occurs due to shrinkage of photopolymerizable material as it polymerizes, strain caused by heat generated by the exothermic photopolymerization reaction, etc.) in addition to or in combination with their function as thermal sensors. A thermocouple or thermistor can be connected to the base member, in addition to or in place of the thin film sensor (the thermocouple generating a voltage in response to heat, as opposed to a change in resistance in response to heat and/or strain). An infra-red sensor can be directed at the base member, in addition to or as an alternative to any of the foregoing.

3. Test Methods.

Figure 9:
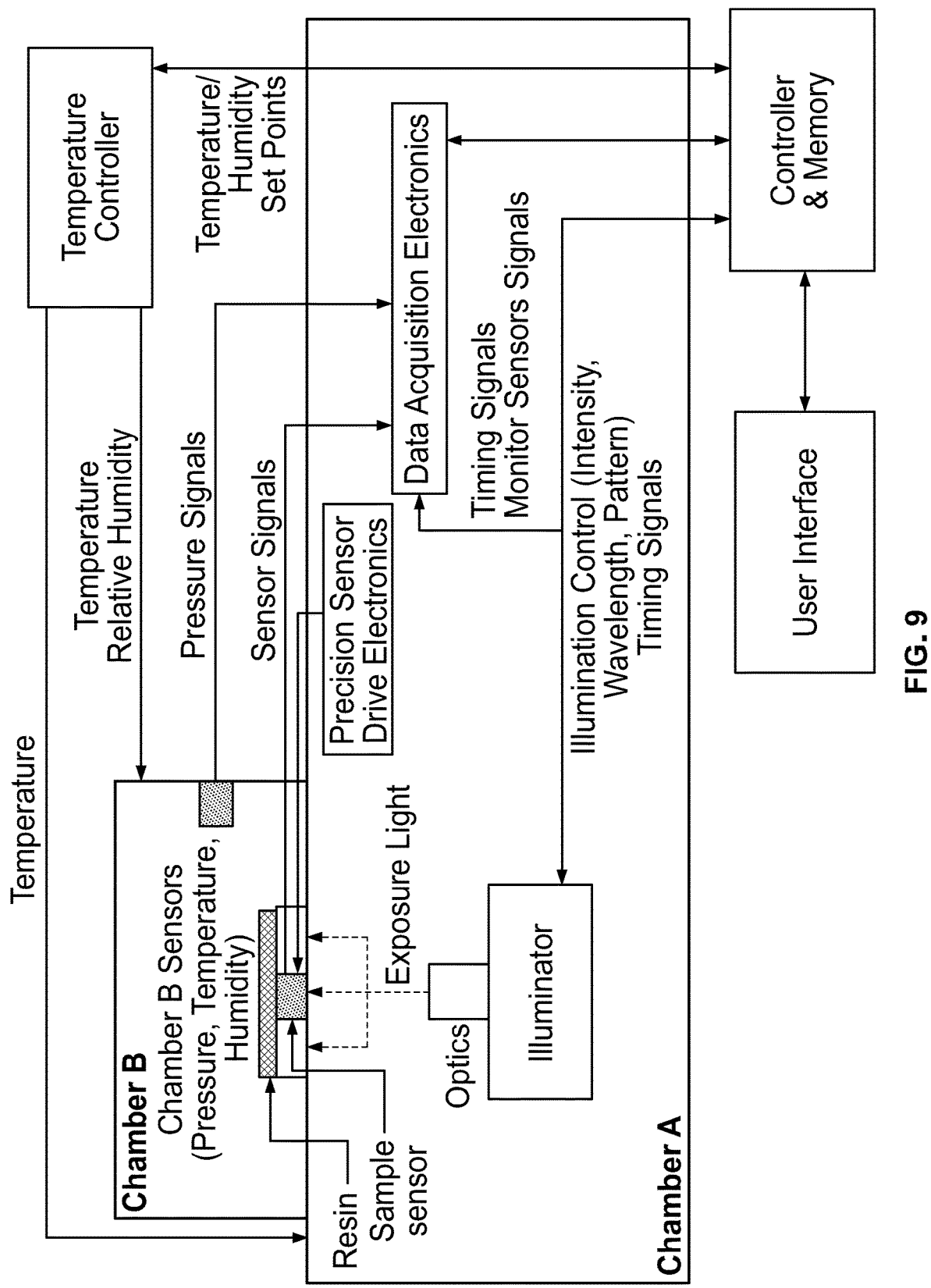
FIG. 9 is a schematic illustration of an apparatus of the present invention.

Because the resins are sensitive to fluctuations in temperature and humidity, temperature and humidity are preferably sensed and controlled, as shown in FIG. 9 (though a simplified, albeit less accurate, test can be performed simply with a light source, as noted above). Also, since results can vary depending on barometric pressure, the barometric pressure is optionally, but in some embodiments preferably, recorded, along with the sensed heat of reaction and/or strain produced during the test, so that photosensitivity can be calculated with reference to the barometric pressure at which the test was conducted.

Thus as noted above, a method of determining the photosensitivity of a photopolymerizable material can be carried out by: (a) depositing a sample of the photopolymerizable material into the well of a test cell or test apparatus as described above; then (b) exposing the photopolymerizable material to a predetermined dose of light through the base member; and (c) sensing heat and/or strain generated by the resin with the sensor in response to the exposure as a measure of the photosensitivity of the photopolymerizable material.

In some embodiments, the temperature, humidity, and/or pressure within the test chamber is sensed, concurrently with the step of (c) sensing heat and/or strain.

In some embodiments, the method further includes the step of: (d) determining the photosensitivity of the photopolymerizable material from the heat and/or strain sensed in step (c), and optionally from the sensed temperature, humidity, and/or pressure within the test chamber.

In some embodiments, as discussed further below, the sensing step is carried out by taking a plurality of heat and/or strain measures (e.g., at least 100, 200, or 400 separate measures) during the exposing step.

In some embodiments, as discussed further below, the sensing step includes determining an induction time for the resin in response to the dose of light, with a shorter induction time indicating greater photosensitivity.

While the temperature and humidity at which the test is carried out can be set at any convenient point, a temperature set point of 25 degrees centigrade, at 50 percent relative humidity, may typically be used. The choice of wavelength may be based upon the material being tested, but light in the ultraviolet range may be used, typically that emitted from an LED light source having a peak wavelength of 385 to 390 nanometers. The light dose to the material during the test is typically from 0.01 or 0.1 mW/cm$^2$ to 5 or 50 mW/cm$^2$, for up to 30 or 60 seconds exposure time, and photosensitivity can be determined from the induction time of the resin in response to the light dose.

"Induction time" as used herein refers to the time required, after the onset of the light dose, for the resin to begin releasing heat, and/or exerting strain (as detected by the sensor(s)). For example, in some embodiments, the sensors (20) illustrated in FIGS. 4-8 may detect the released heat and/or strain. The longer the induction time, the lesser the photosensitivity of the resin (and, conversely, the shorter the induction time, the greater the photosensitivity of the resin). Accuracy of the determination of the induction time can be enhanced by more frequent sampling of the temperature of the resin (and/or strain exerted by the resin), during its exposure to the light dose, and preferably at least 100, 200, 400, or 500 separate temperature and/or strain measures are taken, up to 1000 or more). Additional features of the sensed data, such as the steepness of the rise in temperature/strain, peak signal, and decay after peak may also be utilized as indications of photosensitivity, alone or in combination with induction time.

Note also that the entirety of the light-transmissive base member need not be exposed to light during the test. The region exposed to light may be based upon the particular sensor type and configuration employed, but, for a thin film thermal or strain sensor, it can include the region of the base member supporting, or directly beneath, the resistive element.

In some embodiments, a curve of recorded strain and/or recorded temperature versus exposure time may be utilized to determine photosensitivity using embodiments of the apparatus of the present invention. Regarding the section of the curve used to determine photosensitivity (such as when expressed as Fc), the initial portion of the curve before the initial temperature and/or strain rise time is preferably used. The rest of the curve can optionally be captured, as it has additional information about the photosensitivity of the resin. For resolution better than 0.5% of the induction time, that region of the curve is preferably sampled at least 1000 separate times (that is, at least 1000 separate temperature and/or strain measures are taken).

More specifically, in some embodiments, the exposure time required to initiate curing of the resin at a given exposure irradiance determines the photosensitivity through the relation $$\text{Photosensitivity} = t\_cure * I\_0$$

where t_cure is the exposure time required to initiate cure and I_0 is the irradiance (energy flux per unit area) incident on the resin at the location of the sensor. The time to cure is determined from critical points in the transient temperature and/or strain signal, S(t), measured by the sensor. These critical points can include, for example, the time to when the signal value first becomes greater than a threshold, (e.g., a minimum t such that S(t)>S_threshold), and/or the time to when the signal's derivative is greater than a threshold value, (e.g., a minimum t such that dS(t)/dt>dS/dt_thresh), and/or the time when the signal first reaches a local maximum derivative (e.g., a minimum t such that argmax_t (dS/dt)), and/or the time when the second derivative of the signal reaches its maximum value (e.g., minimum t such that argmax_t (d$^2$S/dt$^2$)), and/or the time when the tangent lines best-fit to the curve before and after the first initial rise time intersect. Other techniques for determining photosensitivity will be apparent to those skilled in the art, and hence the foregoing are intended as specific examples, and are not to be construed as limiting of the present invention.

An optional secondary window can be included on the test cell as noted above, on which different regions of resin can be polymerized with different light doses to different heights, and the heights of each polymerized region measured with a micrometer, to conduct an alternate or comparative test of photosensitivity, if desired. The secondary window in the illustrated embodiment is removable and disposable, and is provided with lifting tabs (43) to facilitate removal and replacement. The alternate photosensitivity test can be conducted in accordance with known techniques, or variations thereof that will be apparent to those skilled in the art. See, e.g., P. Jacobs, *Rapid Prototyping & Manufacturing: Fundamentals of StereoLithography*, pages 33, 270-274 (1$^{st}$ Ed. 1992).

FIG. 9 is a schematic illustration of an apparatus of the present invention. As illustrated in FIG. 9, in some embodiments, a test apparatus (e.g., test apparatus (100) discussed herein) may include two chambers (e.g., Chamber A and Chamber B), though the present invention is not limited thereto. A first chamber (e.g., Chamber B) may include the test cell, such as test cell (10) illustrated and discussed with respect to FIGS. 1-5. The first chamber may also include sensors, including sensors (20) described herein. The sensors may include, for example, pressure sensors, temperature sensors, and/or humidity sensors, though the present invention is not limited thereto. The first chamber may also include a sample sensor (e.g., sensor (20)), which may, in some embodiments, include thin film resistive sensors (30)

such as those illustrated and discussed herein with respect to FIGS. 7 and 8. As discussed herein, a photopolymerizable material (e.g., a resin) may be placed within a test cell of the first chamber to determine a photosensitivity of the photopolymerizable material.

The test apparatus may further include a second chamber (e.g., Chamber A) which may include machinery to operate and control the test cell. For example, the second chamber may include an illuminator which may transmit light through one or more optics into the first chamber. In some embodiments, the light may be translated through a transmissive window of a test cell in the first chamber.

The second chamber may also include precision sensor drive electronics that are communicatively coupled to the sample sensor, e.g., sample sensor (20), of the first chamber. The sensor drive electronics may be configured to send and/or receive an electronic signal from the sample sensor. In some embodiments, the precision sensor drive electronics may be configured to exchange one or more control signals with the sample sensor so as to assist in the determination of the photosensitivity of the photopolymerizable material.

The second chamber may also include data acquisition electronics. The data acquisition electronics may be configured to be communicatively coupled to one or more sensors (e.g., sample sensor (20), pressure, temperature, and/or humidity sensors) within the first chamber and/or second chamber. The data acquisition electronics may receive data from the sensors within the first chamber and/or second chamber to gather data associated with the inventive processes described herein.

A temperature controller may be communicatively coupled to the first chamber and/or the second chamber. The temperature controller may be configured to control a temperature and/or relative humidity of the test apparatus. In some embodiments, the temperature controller may be configured to control the temperature and/or humidity based on signals received from one or more sensors in the first and/or the second chamber of the test apparatus. In some embodiments, the temperature controller may be an external air temperature and humidity control unit that may be coupled to the test apparatus, such as through an air inlet duct (121) and/or an air outlet duct (122) as illustrated in FIG. 3.

The test apparatus may also include a controller and a memory coupled to the controller. The controller may control operation of the test apparatus. For example, the controller may be communicatively coupled to the temperature controller to exchange temperature and/or humidity set points to control temperature and/or humidity of the test apparatus. The controller may be communicatively coupled to the data acquisition electronics to exchange sensor readings and/or timing signals and/or to monitor sensor signals from the first and/or second chambers. The controller may be communicatively coupled to the illuminator to exchange timing signals and/or to provide illumination control (e.g., control of an intensity, wavelength, and/or pattern) for the illuminator. The controller may provide control signals and interpret data responsive thereto, using algorithms described herein, to determine photosensitivity of the photopolymerizable material in the first chamber.

The controller may be of any suitable type, such as a general-purpose computer. The memory may include a volatile (or "working") memory, such as random-access memory, and/or at least one non-volatile or persistent memory, such as a hard drive or a flash drive. The controller may use hardware, software implemented with hardware, firmware, tangible computer-readable storage media having instructions stored thereon, and/or a combination thereof, and may be implemented in one or more computer systems or other processing systems. The controller may also utilize a virtual instance of a computer. As such, the devices and methods described herein may be embodied in any combination of hardware and software that may all generally be referred to herein as a "circuit," "component," and/or "system." Furthermore, aspects of the present invention may take the form of a computer program product embodied in one or more computer readable media having computer readable program code embodied thereon.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

The controller may be configured to execute computer program code for carrying out operations for aspects of the present invention, which computer program code may be written in any combination of one or more programming languages, including an object oriented programming language such as Java, Scala, Smalltalk, Eiffel, JADE, Emerald, C++, C#, VB.NET, or the like, conventional procedural programming languages, such as the "C" programming language, Visual Basic, Fortran 2003, COBOL 2002, PHP, ABAP, dynamic programming languages such as Python, PERL, Ruby, and Groovy, or other programming languages.

The controller may be, or may include, one or more programmable general purpose or special-purpose microprocessors, digital signal processors (DSPs), programmable controllers, application specific integrated circuits (ASICs), programmable logic devices (PLDs), field-programmable gate arrays (FPGAs), trusted platform modules (TPMs), or a combination of such or similar devices, which may be collocated or distributed across one or more data networks.

Connections between internal components of the test apparatus are shown only in part and connections between internal components of the test apparatus and external components are not shown for clarity, but are provided by additional components known in the art, such as busses, input/output boards, communication adapters, network adapters, etc. The connections between the internal components of the test apparatus, therefore, may include, for example, a system bus, a Peripheral Component Interconnect (PCI) bus or PCI-Express bus, a HyperTransport or industry standard architecture (ISA) bus, a small computer system interface (SCSI) bus, a universal serial bus (USB), IIC (I2C) bus, an Advanced Technology Attachment (ATA) bus, a Serial ATA (SATA) bus, and/or an Institute of Electrical and Electronics Engineers (IEEE) standard 1394 bus, also called "Firewire."

A user interface may be coupled to the controller. The user interface may be of any suitable type. The user interface may include a display and/or one or more user input devices. The display may be accessible to the controller via the connections between the system components. The display may provide graphical user interfaces for receiving input, displaying intermediate operation/data, and/or exporting output of the methods described herein. The display may include, but is not limited to, a monitor, a touch screen device, etc., including combinations thereof. The input device may include, but is not limited to, a mouse, keyboard, touch screen, stylus, camera, etc., including combinations thereof. The input device may be accessible to the controller via the connections between the system components. The user interface may interface with and/or be operated by computer readable software code instructions resident in the memory that are executed by the controller.

Though FIG. 9 illustrates example locations of components within particular chambers with example connections therebetween, it will be understood that other configurations are possible without deviating from the present inventive concepts. For example, component illustrated in one chamber may, in some embodiments, be placed in another chamber, or vice versa. Similarly, though two chambers are illustrated, more, or fewer, chambers are possible. In some embodiments, the controller may be included as part of the test apparatus. In some embodiments, the controller may be remote and may, for example, communicate with the test apparatus with a network or other communication infrastructure (e.g., a wired or wireless network).

The foregoing is illustrative of the present invention, and is not to be construed as limiting thereof. The invention is defined by the following claims, with equivalents of the claims to be included therein.

We claim:

1. A test cell useful for determining a photosensitivity of a photopolymerizable material, comprising:
 (a) a support plate having a top surface portion, a bottom surface portion, and an opening extending through the support plate;
 (b) a light-transmissive base member removably or permanently connected to said bottom surface portion to form with said opening a well, wherein the photopolymerizable material can be deposited into said well; and
 (c) a sensor comprising a thermal sensor, strain sensor, or combination thereof operatively associated with said light-transmissive base member.

2. The test cell of claim 1, wherein said light-transmissive base member is comprised of quartz, glass, sapphire, an organic polymer, or a combination thereof.

3. The test cell of claim 1, wherein said sensor comprises a non-contact infra-red sensor operatively associated with said light-transmissive base member.

4. The test cell of claim 1, wherein said sensor comprises a thermocouple connected to said light-transmissive base member.

5. The test cell of claim 1, wherein said sensor comprises a resistive temperature sensor connected to said light-transmissive base member.

6. The test cell of claim 1, wherein said sensor comprises a thin film sensor connected to said light-transmissive base member.

7. The test cell of claim 6, wherein said thin film sensor comprises:
 (i) a resistive element;
 (ii) a pair of input arms electrically connected to said resistive element; and
 (iii) optionally, one or two sense arms electrically connected to said resistive element.

8. The test cell of claim 7, wherein said resistive element, said input arms, and optionally said sense arms when present, are comprised of platinum, titanium, or indium tin oxide (ITO).

9. The test cell of claim 7, wherein said input arms, and optionally said sense arms when present, further comprise a conductive upper coat.

10. The test cell of claim 6, further comprising a light transmissive protective top coating formed on said sensor.

11. The test cell of claim 1, wherein said sensor comprises a plurality of sensors.

12. The test cell of claim 1, further comprising a plurality of captive fasteners connected to said support plate and extending downward from said bottom surface portion.

13. The test cell of claim 1, further comprising an alignment assembly connected to or formed on said support plate bottom surface portion.

14. The test cell of claim 1, further comprising a secondary well formed in said support plate, said secondary well having an optionally removable, light-transmissive, floor.

15. The test cell of claim 1, wherein said photopolymerizable material comprises a stereolithography resin, a lithography resist, or a light-curable printing ink.

16. A method of determining a photosensitivity of a photopolymerizable material, comprising:
 (a) depositing a sample of said photopolymerizable material into a well of a test cell comprising a support plate having a top surface portion, a bottom surface portion, and an opening extending therebetween; a light-transmissive base member removably or permanently connected to said bottom surface portion to form with said opening a well, into which well photopolymerizable material can be deposited; and a sensor comprising a thermal sensor, strain sensor, or combination thereof operatively associated with said light-transmissive base member; and
 (b) exposing said photopolymerizable material to a predetermined dose of light through said light-transmissive base member; and
 (c) sensing heat and/or strain generated by said photopolymerizable material with said sensor in response to said exposure as a measure of the photosensitivity of said photopolymerizable material.

17. The method of claim 16, wherein said sensing step is carried out by taking a plurality of heat and/or strain measures during said exposing step.

18. The method of claim 16, wherein said sensing step includes determining an induction time for said photopolymerizable material in response to said dose of light, with a shorter induction time indicating greater photosensitivity.

19. A test apparatus useful for measuring a photosensitivity of a photopolymerizable material, comprising:
  (a) a test cell comprising a support plate having a top surface portion, a bottom surface portion, and an opening extending therebetween; a light-transmissive base member removably or permanently connected to said bottom surface portion to form with said opening a well, into which well photopolymerizable material can be deposited; and a sensor comprising a thermal sensor, strain sensor, or combination thereof operatively associated with said light-transmissive base member; and
  (b) a light source operatively associated with said test cell and configured to direct light through said light-transmissive base member.

20. The test apparatus of claim 19, further comprising:
  (c) an outer housing;
  (d) a test chamber, with said test cell positioned in said test chamber; and
  (e) a door connected to said outer housing and through which said test chamber is accessed,
  wherein said light source is contained within said outer housing (but optionally outside said test chamber).

21. The test apparatus of claim 20, further comprising a temperature sensor operatively associated with said test chamber.

22. The test apparatus of claim 20, further comprising a humidity sensor operatively associated with said test chamber.

23. The test apparatus of claim 20, further comprising a pressure sensor operatively associated with said test chamber.

24. The test apparatus of claim 20, further comprising an air inlet duct and an air outlet duct operatively associated with said test chamber, and configured for operative association with an air temperature and humidity control unit.

25. The test apparatus of claim 19, said light source further comprising a shutter configured for controlling light directed through said light-transmissive base member.

26. The test apparatus of claim 20, further comprising an elevated pedestal within said test chamber on which said test cell is mounted.

27. The test apparatus of claim 19, further comprising a spill protection window positioned between said test cell and said light source.

28. A method of determining the photosensitivity of a photopolymerizable material, comprising:
  (a) depositing a sample of said photopolymerizable material into the well of a test apparatus of claim 20; and
  (b) exposing said photopolymerizable material to a predetermined dose of light through said light-transmissive base member; and
  (c) sensing heat and/or strain generated by said photopolymerizable material with said sensor in response to said exposure as a measure of the photosensitivity of said photopolymerizable material.

29. The method of claim 28, further comprising sensing a temperature, humidity, and/or pressure within said test chamber, concurrently with said step of (c) sensing heat and/or strain.

30. The method of claim 29, further comprising the step of:
  (d) determining the photosensitivity of said photopolymerizable material from said heat and/or strain sensed in step (c), and optionally from said sensed temperature, humidity, and/or pressure within said test chamber.

31. The method of claim 28, wherein said sensing step is carried out by taking a plurality of heat and/or strain measures during said exposing step.

32. The method of claim 28, wherein said sensing step includes determining an induction time for said photopolymerizable material in response to said dose of light, with a shorter induction time indicating greater photosensitivity.

33. The test cell of claim 1, wherein sidewalls of said well are formed by the support plate, and wherein a bottom surface of said well is formed by the light-transmissive base member.

* * * * *